(12) United States Patent
Liang (10) Patent No.: US 12,482,677 B2
(45) Date of Patent: Nov. 25, 2025

(54) WAFER PROCESSING APPARATUS INCLUDING ROTATABLE ELEMENT CONNECTED TO PRESSURE APPLYING ELEMENT

(71) Applicant: GlobalWafers Co., Ltd., Hsinchu (TW)

(72) Inventor: Hsiu Chi Liang, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 897 days.

(21) Appl. No.: 17/720,282

(22) Filed: Apr. 13, 2022

(65) Prior Publication Data
US 2022/0415674 A1    Dec. 29, 2022

(30) Foreign Application Priority Data
Jun. 24, 2021    (TW) ................. 110123089

(51) Int. Cl.
| H01L 21/67 | (2006.01) |
| H01L 21/687 | (2006.01) |
| H05B 6/64 | (2006.01) |
| H05B 6/80 | (2006.01) |

(52) U.S. Cl.
CPC .. *H01L 21/67103* (2013.01); *H01L 21/67248* (2013.01); *H01L 21/67259* (2013.01); *H01L 21/68764* (2013.01); *H05B 6/6411* (2013.01); *H05B 6/645* (2013.01); *H05B 6/80* (2013.01)

(58) Field of Classification Search
CPC ......... H01L 21/67103; H01L 21/67248; H01L 21/67259; H01L 21/68764; H01L 21/67092; H01L 21/67288; H05B 6/6411; H05B 6/645; H05B 6/80; B28D 5/02; B28D 5/0058; B28D 5/0082; C30B 33/00; C30B 33/02
See application file for complete search history.

(56) References Cited

U.S. PATENT DOCUMENTS

| 2007/0298690 A1 | 12/2007 | Liu et al. |
| 2021/0320024 A1* | 10/2021 | Yamauchi ............. H01L 21/681 |

FOREIGN PATENT DOCUMENTS

| CN | 102543718 | 7/2012 |
| DE | 19825381 | 12/1999 |
| DE | 102012003903 | 8/2013 |
| JP | 4661039 | 3/2011 |
| KR | 980012020 | 4/1998 |
| KR | 1020130034179 | 4/2013 |

(Continued)

OTHER PUBLICATIONS

"Office Action of China Counterpart Application", issued on Feb. 13, 2025, p. 1-p. 8.

(Continued)

*Primary Examiner* — John P. Dulka
(74) *Attorney, Agent, or Firm* — JCIPRNET (57) ABSTRACT

A wafer processing apparatus includes a pressure applying element, a rotatable element, a control element, and a heat source. The pressure applying element includes a first pressure applying head having a first working surface and a second pressure applying head having a second working surface. The rotatable element and the pressure applying element are connected. The control element is electrically connected to the rotatable element. The heat source is disposed beside the pressure applying element.

20 Claims, 4 Drawing Sheets

(56) References Cited

FOREIGN PATENT DOCUMENTS

| KR | 20150067951 | 6/2015 |
|----|-------------|--------|
| KR | 20210009849 | 1/2021 |
| TW | 348273 | 12/1998 |
| TW | 476815 | 2/2002 |

OTHER PUBLICATIONS

"Notice of allowance of China Counterpart Application", issued on Jul. 16, 2025, p. 1-p. 4.

* cited by examiner

WAFER PROCESSING APPARATUS INCLUDING ROTATABLE ELEMENT CONNECTED TO PRESSURE APPLYING ELEMENT

CROSS-REFERENCE TO RELATED APPLICATION

This application claims the priority benefit of Taiwan application serial no. 110123089, filed on Jun. 24, 2021. The entirety of the above-mentioned patent application is hereby incorporated by reference herein and made a part of this specification.

BACKGROUND

Technical Field

The invention relates to a processing apparatus, and particularly relates to a wafer processing apparatus.

Description of Related Art

In semiconductor industry, wafer materials include, for example, silicon (Si), gallium arsenide (GaAs), indium phosphide (InP), indium antimonide (InSb), gallium nitride (GaN), silicon carbide (SiC) or zinc selenide (ZnSe). Generally, a method of manufacturing a wafer includes first forming an ingot, and then slicing the ingot to obtain wafers. The ingot is, for example, manufactured in a high-temperature environment. At present, a growth method of the ingot includes a Czochralski process, a physical vapor transport (PVT) method, a high temperature chemical vapor deposition (HT-CVD) method, a liquid phase epitaxy (LPE) method, etc.

A seed crystal is placed in a high-temperature furnace, and the seed crystal contacts a gaseous or liquid raw material to form a semiconductor material on a surface of the seed crystal until an ingot with a desired size is obtained. The ingot may have different crystalline structures depending on the manufacturing method and raw materials. For example, the ingot of silicon carbide includes 3C-silicon carbide, 4H-silicon carbide, 6H-silicon carbide, etc. The 3C-silicon carbide belongs to a cubic crystal system, while the 4H-silicon carbide and the 6H-silicon carbide belong to a hexagonal crystal system.

The ingot grows in a high-temperature environment of hundreds to thousands of degrees Celsius. During the growth of the ingot, an end of the ingot close to the seed crystal is referred to as a seed end, and an end of the ingot that is far away from the seed crystal is referred to as a dome end. The seed end and the dome end probably have a temperature difference of tens to hundreds of degrees Celsius due to different positions thereof. In this case, the inside of the ingot may probably have a residual stress caused by the temperature difference. If the ingot is made of a silicon carbide material, for example, the seed end is a silicon end and the dome end is a carbon end, the silicon end of the ingot has residual compressive stress, and the carbon end of the ingot has residual tensile stress.

After the growth of the ingot is completed, the ingot is cooled down to room temperature by furnace cooling or other means. When the ingot cools to below a plastic-elastic transition temperature, the ingot may have a property of elastic deformation and may no longer release stress through plastic deformation (for example, dislocation generation, slippage and/or bonding). For example, an edge dislocation may slip to a crystallization plane on a corresponding slip plane along a slipping direction. When the ingot has the property of elastic deformation, a thermal contraction of the ingot substantially conforms to a following equation: $\varepsilon=k\Delta T$, in the above equation, $\varepsilon$ is a strain, $k$ is a thermal expansion coefficient, and $\Delta T$ is a temperature difference. When the ingot is cooled down, if a temperature of the seed end is different from a temperature of the dome end, the seed end and the dome end will start to cool down at different temperatures, so that a degree of thermal contraction of the seed end is different from that of the dome end. For example, the temperature of the seed end may drop from 1800° C. to 20° C., and the temperature of the dome end may drop from 1900° C. to 20° C. This situation leads to residual compressive stress and residual tensile stress appearing in the ingot. In other words, since the $\Delta T$ at the seed end is different from the $\Delta T$ at the dome end, the $\varepsilon$ at the seed end is different from the $\varepsilon$ at the dome end.

After the ingot is cooled down, cutting equipment is used to remove the poorly shaped head and tail ends of the ingot, and then the ingot is ground to a desired size (for example, 3 inches to 12 inches) by a grinding device. In some manufacturing processes, a flat edge or a V-shaped groove is ground on the edge of the ingot. This flat edge or V-shaped groove is adapted for serving as a mark of a crystallization direction of the ingot or adapted for fixing the ingot.

Then, the ingot is sliced to obtain a plurality of wafers. For example, a method of slicing the ingot includes performing cutting by using a knife or a steel wire in collaboration with abrasive particles (such as diamond particles). In some cases, compressive stress and tensile stress remain in the wafers as well as in the ingot. In some manufacturing processes, corners of the wafer are ground into round corners to prevent the corners of the wafer from cracking due to collisions.

Then, grinding and polishing processes are performed on the wafer to improve surface quality of the wafer. The method of performing grinding and polishing processes on the wafer includes, for example, a physical grinding process and a chemical mechanical grinding process. In the physical grinding process, for example, a grinding liquid containing diamond particles or other particles with higher hardness is used in collaboration with a polishing pad to grind a wafer surface. The physical grinding process mainly adopts a mechanical force to treat the wafer surface. The chemical mechanical grinding process is to use corrosive grinding liquid and abrasives in collaboration with a polishing pad to grind the wafer surface. The corrosive grinding fluid in the chemical mechanical grinding process may have a chemical reaction with the wafer surface to transform an uneven part of the wafer surface into a material with less hardness, such that the abrasives may easily remove the uneven part of the wafer surface.

After the grinding and polishing processes, a thickness of the wafer is reduced (for example, by hundreds of microns). The residual tensile stress and compressive stress inside the wafer may be partially released due to the decrease of the thickness of the wafer to cause geometric defects such as bow and/or warp of the wafer.

Therefore, how to repair the above-mentioned geometric defects after slicing or grinding the silicon carbide wafer is an important issue in a manufacturing process of a new generation of semiconductor materials.

SUMMARY

The invention is directed to a wafer processing apparatus, which is adapted to effectively repair geometric defects of a wafer through annealing treatment.

An embodiment of the invention provides a wafer processing apparatus including a pressure applying element, a rotatable element, a control element and a heat source. The pressure applying element includes a first pressure applying head and a second pressure applying head. The first pressure applying head has a first working surface. The second pressure applying head has a second working surface. The first pressure applying head and the second pressure applying head are adapted to abut against each other to clamp a wafer between the first working surface and the second working surface, and press the wafer along a pressure applying direction. The rotatable element is connected to the pressure applying element. The control element is adapted to control the rotatable element to drive the first pressure applying head and the second pressure applying head to rotate, so as to adjust an included angle between the first working surface and the second working surface and a reference plane, where a normal direction of the reference plane is substantially parallel to the pressure applying direction. The heat source is adapted to heat the wafer clamped between the first working surface and the second working surface.

In an embodiment of the invention, the heat source includes a radio frequency coil surrounding the wafer.

In an embodiment of the invention, the wafer processing apparatus further includes a plurality of sacrificial layers disposed on the first working surface and the second working surface to contact the wafer, respectively.

In an embodiment of the invention, the wafer processing apparatus further includes a temperature detector, which is adapted to detect a real-time temperature of the wafer and is electrically connected to the control element.

In an embodiment of the invention, the control element is adapted to control the rotatable element to drive the first pressure applying head and the second pressure applying head to rotate according to a difference between the real-time temperature of the wafer and a predetermined annealing temperature, so as to adjust the included angle to a predetermined angle.

In an embodiment of the invention, the control element is adapted to control the pressure applying element to apply a predetermined pressure to the wafer according to a difference between the real-time temperature of the wafer and a predetermined annealing temperature.

In an embodiment of the invention, the control element is adapted to adjust a heating power of the heat source according to the real-time temperature of the wafer.

In an embodiment of the invention, the wafer processing apparatus further includes an angle detector, which is adapted to detect a real-time angle of the included angle, and is electrically connected to the control element, where the control element is adapted to control the rotatable element to drive the first pressure applying head and the second pressure applying head to rotate according to the real-time angle.

In an embodiment of the invention, the wafer processing apparatus further includes a pressure detector, which is adapted to detect a real-time pressure applied to the wafer by the first pressure applying head and the second pressure applying head, and is electrically connected to the control element, where the control element is adapted to adjust a magnitude of pressure applied to the wafer by the pressure applying element according to the real-time pressure.

In an embodiment of the invention, the control element is adapted to control a time during which the pressure applying element presses the wafer.

In an embodiment of the invention, the control element is adapted to control a time that the rotatable element maintains the included angle to a predetermined angle.

In an embodiment of the invention, the pressure applying element further includes a first pressure applying shaft and a second pressure applying shaft. The first pressure applying shaft is connected to the first pressure applying head. The second pressure applying shaft is connected to the second pressure applying head. An axial direction of the first pressure applying shaft and an axial direction of the second pressure applying shaft are substantially parallel to the pressure applying direction. A projection position of the first pressure applying shaft on the wafer is misaligned with a projection position of the second pressure applying shaft on the wafer.

In an embodiment of the invention, the first pressure applying head has a plurality of upper pressure applying portions, and the second pressure applying head has a plurality of lower pressure applying portions. The plurality of upper pressure applying portions are structurally separated from each other and correspond to a plurality of regions of the wafer, respectively. The plurality of lower pressure applying portions are structurally separated from each other and correspond to the plurality of regions of the wafer, respectively.

In an embodiment of the invention, the plurality of regions of the wafer include a first region, a second region, and a third region. A geometric center of the wafer is located in the first region, the third region of the wafer has an edge of the wafer, and the second region is located between the first region and the third region. The plurality of upper pressure applying portions include a first upper pressure applying portion, a second upper pressure applying portion and a third upper pressure applying portion corresponding to the first region, the second region and the third region of the wafer, respectively. The plurality of lower pressure applying portions include a first lower pressure applying portion, a second lower pressure applying portion and a third lower pressure applying portion corresponding to the first region, the second region and the third region of the wafer, respectively. The first upper pressure applying portion and the first lower pressure applying portion are adapted for applying a first pressure to the first region of the wafer. The second upper pressure applying portion and the second lower pressure applying portion are adapted for applying a second pressure to the second region of the wafer. The third upper pressure applying portion and the third lower pressure applying portion are adapted for applying a third pressure to the third region of the wafer. The first pressure is greater than the second pressure, and the second pressure is greater than the third pressure.

An embodiment of the invention provides a wafer processing apparatus including a pressure applying element, a rotatable element, a control element and a heat source. The pressure applying element includes a first pressure applying head having a first working surface and a second pressure applying head having a second working surface. The rotatable element and the pressure applying element are connected. The control element is electrically connected to the rotatable element. The heat source is disposed beside the pressure applying element.

In an embodiment of the invention, the heat source includes a radio frequency coil.

In an embodiment of the invention, the wafer processing apparatus further includes a plurality of sacrificial layers, which are disposed on the first working surface and the second working surface, respectively.

In an embodiment of the invention, the wafer processing apparatus further includes a temperature detector electrically connected to the control element.

In an embodiment of the invention, the wafer processing apparatus further includes an angle detector electrically connected to the control element.

In an embodiment of the invention, the wafer processing apparatus further includes a pressure detector electrically connected to the control element.

In an embodiment of the invention, the pressure applying element further includes a first pressure applying shaft and a second pressure applying shaft. The first pressure applying shaft is connected to the first pressure applying head. The second pressure applying shaft is connected to the second pressure applying head. The first pressure applying shaft is misaligned with the second pressure applying shaft.

In an embodiment of the invention, the first pressure applying head has a plurality of upper pressure applying portions, and the second pressure applying head has a plurality of lower pressure applying portions. The plurality of upper pressure applying portions are structurally separated from each other, and the plurality of lower pressure applying portions are structurally separated from each other and correspond to the plurality of upper pressure applying portions, respectively.

Based on the above description, in an embodiment of the invention, the wafer processing equipment may use the first working surface of the first pressure applying head and the second working surface of the second pressure applying head to clamp a wafer, and may use the rotatable element to drive the first pressure applying head and the second pressure applying head to adjust the included angle between the first working surface of the first pressure applying head and the second working surface of the second pressure applying head and the reference plane. In this way, the wafer processing apparatus may adjust the included angle between the first working surface of the first pressure applying head and the second working surface of the second pressure applying head and the reference plane at any time, so as to achieve a good effect of repairing the geometric defects of the wafer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
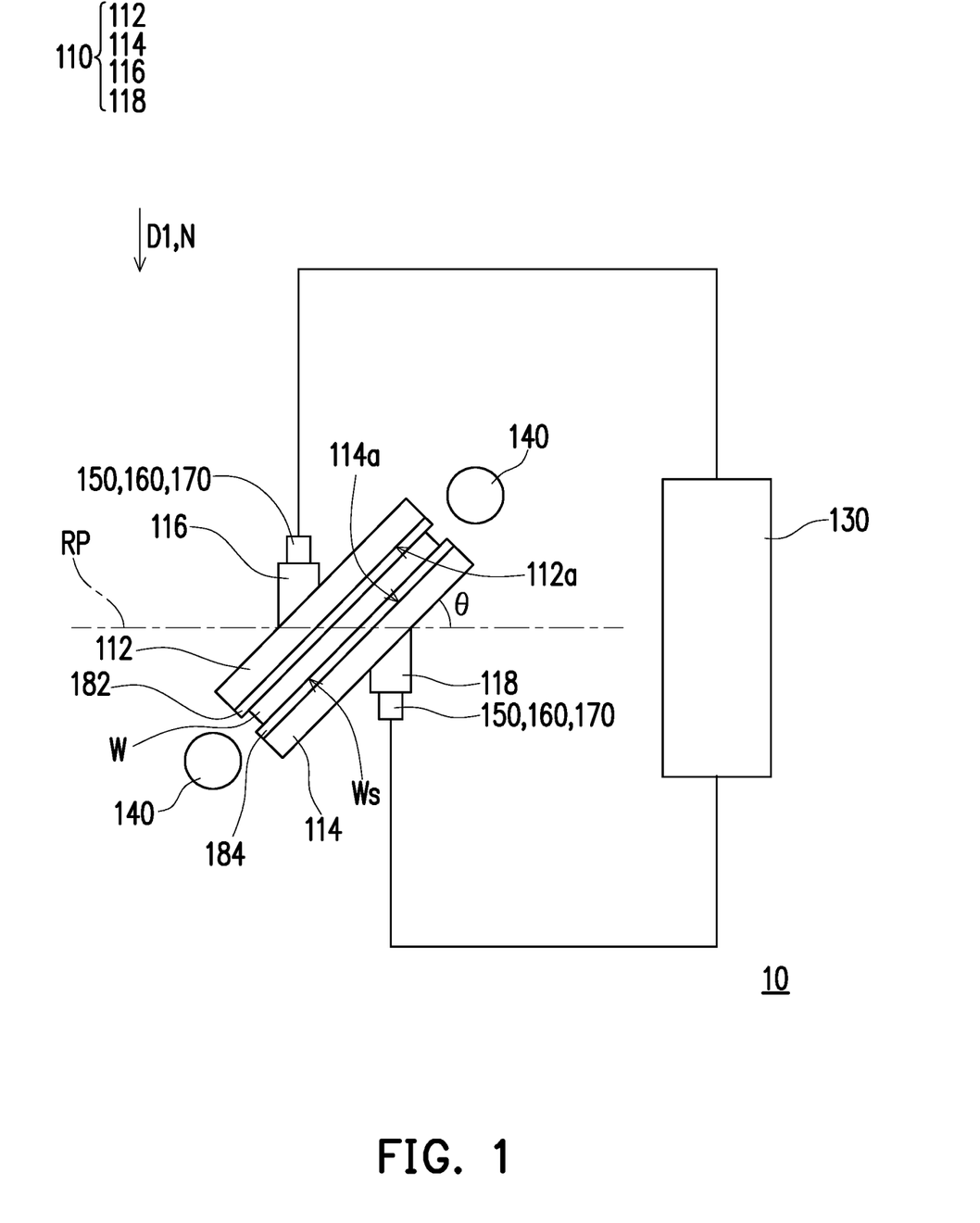
FIG. 1 is a schematic diagram of a wafer processing apparatus according to an embodiment of the invention.

FIG. 1 is a schematic diagram of a wafer processing apparatus according to an embodiment of the invention.

Figure 2:
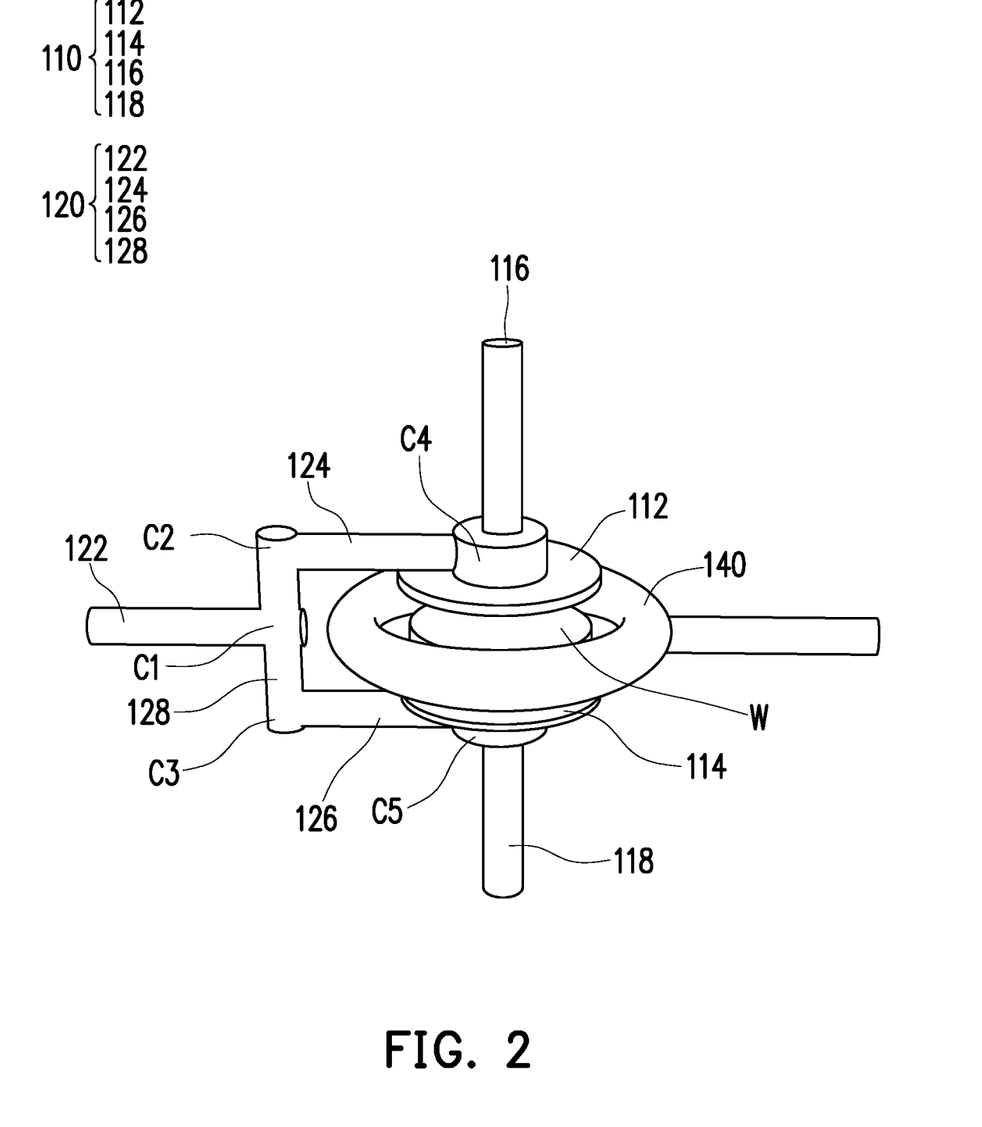
FIG. 2 shows a pressure applying element, a rotatable element and a heat source of a wafer processing apparatus according to an embodiment of the invention.

FIG. 2 shows a pressure applying element, a rotatable element and a heat source of a wafer processing apparatus according to an embodiment of the invention.

Referring to FIG. 1 and FIG. 2, a wafer processing apparatus 10 includes a pressure applying element 110. The pressure applying element 110 includes a first pressure applying head 112 and a second pressure applying head 114. The first pressure applying head 112 has a first working surface 112a. The second pressure applying head 114 has a second working surface 114a. The first pressure applying head 112 and the second pressure applying head 114 are adapted to abut against each other to clamp a wafer W between the first working surface 112a and the second working surface 114a, and press the wafer along a pressure applying direction D1.

For example, in the embodiment, the pressure applying element further includes a first pressure applying shaft 116 and a second pressure applying shaft 118, where the first pressure applying shaft 116 is connected to the first pressure applying head 112, and the second pressure applying shaft 118 is connected to the second pressure applying head 114. In the embodiment, an axial direction of the first pressure applying shaft 116 and an axial direction of the second pressure applying shaft 118 are substantially parallel to the pressure applying direction D1, but the invention is not limited thereto. In the embodiment, the pressure applying element 110 may be of a hydraulic type, a pneumatic type, a screw type or any other applicable type, which is not limited by the invention.

The first pressure applying head 112 and the second pressure applying head 114 of the pressure applying element 110 are adapted to press the wafer W to form a shear force on the wafer W. The shear force may make the geometric defects of the wafer W to be effectively repaired by annealing treatment. To be specific, in the embodiment, when the pressure applying element 110 presses the wafer W, the first working surface 112a of the first pressure applying head 112 and the second working surface 114a of the second pressure applying head 114 have an included angle θ with a reference plane RP (for example, a horizontal plane), where a normal direction N of the reference plane RP is substantially parallel to the pressure applying direction D1; thereby, the first pressure applying shaft 116 and the second pressure applying shaft 118 drive the first pressure applying head 112 and the second pressure applying head 114 to press the wafer W to form the shear force on the wafer W.

For example, in the embodiment, the first pressure applying shaft 116 and the second pressure applying shaft 118 may be selectively misaligned. Furthermore, when the pressure applying element 110 presses the wafer W, a projection position of the first pressure applying shaft 116 on the wafer W and a projection position of the second pressure applying shaft 118 on the wafer W may be selectively misaligned. In this way, a component of the force applied by the pressure applying element 110 to the wafer W that is parallel to a surface Ws of the wafer W, such as an upper surface and a lower surface may be increased, thereby increasing the shear force applied to the wafer W.

Referring to FIG. 1, in addition, in the embodiment, the wafer processing apparatus 10 may further optionally include a sacrificial layer 182 and a sacrificial layer 184, which are respectively disposed on the first working surface 112a of the first pressure applying head 112 and the second working surface 114a of the second pressure applying head 114. The sacrificial layer 182 and the sacrificial layer 184 are used to contact the wafer W, so as to prevent the wafer W from directly contacting the first pressure applying head 112 and the second pressure applying head 114 to cause unexpected chemical reactions at high temperatures, and the sacrificial layers 182, 184 may be multi-layer or single-layer, and at least contain the same material as that of the wafer W. By using the sacrificial layers 182, 184 of the same material as that of the wafer W to directly contact the wafer W may prevent generation of unexpected chemical reactions from affecting the quality of the wafer W. For example, in the embodiment, if the material of the wafer W is silicon carbide, the material of the sacrificial layers 182 and 184 may also be silicon carbide that is the same as the material of the wafer W, but the invention is not limited thereto.

Referring to FIG. 1 and FIG. 2, the wafer processing apparatus 10 further includes the rotatable element 120 (shown in FIG. 2), which is connected to the pressure applying element 110. The wafer processing apparatus 10 further includes the control element 130 (shown in FIG. 1), which is electrically connected to the rotatable element 120. The control element 130 is adapted to control the rotatable element 120 to drive the first pressure applying head 112 and the second pressure applying head 114 to rotate, so as to adjust the included angle θ between the first working surface 112a of the first pressure applying head 112 and the second working surface 114a of the second pressure applying head 114 and the reference plane RP (for example, the horizontal plane). In other words, through the cooperation of the control element 130 and the rotatable element 120, the included angle θ between the first working surface 112a of the first pressure applying head 112 and the second working surface 114a of the second pressure applying head 114 and the reference plane RP is adjustable.

Referring to FIG. 2, in the embodiment, the rotatable element 120 may include, for example, a first lateral portion 122, a second lateral portion 124, a third lateral portion 126, and a portrait portion 128, where the first lateral portion 122 and a middle section of the portrait portion 128 are connected at a first connection point C1, one end of the second lateral portion 124 and one end of the third lateral portion 126 are respectively connected to two ends of the portrait portion 128 at a second connection point C2 and a third connection point C3, and the other end of the second lateral portion 124 and the other end of the third lateral portion 126 are respectively connected to the first pressure applying head 112 and the second pressure applying head 114 at a fourth connection point C4 and a fifth connection point C5, where the first connection point C1, the second connection point C2, the third connection point C3, the fourth connection point C4, and the fifth connection point C5 are movable, so that the rotatable element 120 may freely adjust the included angle θ (indicated in FIG. 1) between the first working surface 112a of the first pressure applying head 112 and the second working surface 114a of the second pressure applying head 114 and the reference plane RP.

For example, in the embodiment, the rotatable element 120 may include screws and gears. However, the invention is not limited thereto, and the rotatable element 120 may also include other components. In addition, it should be noted that the invention does not limit the situation that the rotatable element 120 must include the aforementioned first lateral portion 122, second lateral portion 124, third lateral portion 126, and portrait portion 128; in other embodiments, other structures may also be adopted to implement the rotatable element 120, as long as it may drive the first pressure applying head 112 and the second pressure applying head 114 to change the included angle θ.

Referring to FIG. 1 and FIG. 2, the wafer processing apparatus 10 further includes the heat source 140 disposed beside the pressure applying element 110. The heat source 140 is adapted to heat the wafer W clamped between the first working surface 112a of the first pressure applying head 112 and the second working surface 114a of the second pressure applying head 114. For example, in the embodiment, the heat source 140 may include a radio frequency (RF) coil. When the heat source 140 heats the wafer W, the RF coil may surround the wafer W.

It should be noted that the RF coil has the characteristics of local heating and centralized heating. In other words, the RF coil may heat the wafer W without excessively affecting the surrounding components (for example: at least a part of the pressure applying element 110 and/or at least a part of the rotatable element 120). In this way, not only a total thermal energy output of the wafer processing apparatus 10 may be reduced to achieve a power saving effect, the components arranged around the heat source 140 are not easily damaged by heat, which helps to extend a service life of the wafer processing apparatus 10. The components arranged around the heat source 140 are also unnecessary to adopt extremely heat-resistant materials, and there are many choices on materials, which helps to reduce purchase cost of the wafer processing apparatus 10. In addition, an upper limit of a heating temperature of the RF coil is higher than that of the conventional wafer furnace, which helps the wafer processing apparatus 10 to repair geometric defects of various types of the wafers W.

Referring to FIG. 1, in the embodiment, the wafer processing apparatus 10 may further optionally include a temperature detector 150, which is electrically connected to the control element 130. The temperature detector 150 is adapted to detect a real-time temperature of the wafer W. In the embodiment, the control element 130 is adapted to adjust a heating power of the heat source 140 according to the real-time temperature of the wafer W measured by the temperature detector 150.

Referring to FIG. 1, in the embodiment, the control element 130 is adapted to control the rotatable element 120 to drive the first pressure applying head 112 and the second pressure applying head 114 to rotate according to a difference between the real-time temperature of the wafer W measured by the temperature detector 150 and a predetermined annealing temperature, so as to adjust the included angle θ to a predetermined angle. In the embodiment, the wafer processing apparatus 10 may further optionally include an angle detector 160 which is electrically connected to the control element 130. The angle detector 160 is adapted to detect a real-time angle of the included angle θ to determine that the included angle θ is adjusted to the predetermined angle. In the embodiment, the control element 130 is further adapted for controlling a time that the rotatable element maintains the included angle to the predetermined angle. In the embodiment, the wafer processing apparatus 10 may further optionally include a pressure detector 170 which is electrically connected to the control element 130. The pressure detector 170 is adapted to detect a real-time pressure applied to the wafer W by the first pressure applying head 112 and the second pressure applying head 114. The control element 130 is adapted to adjust a pressure applied to the wafer W by the pressure applying element 110 according to the real-time pressure detected by the pressure detector 170. In the embodiment, the control element 130 is further adapted for controlling the time during which the pressure applying element 110 presses the wafer W. The temperature detector 150, the angle detector 160, and the pressure detector 170 mentioned above may feed back the real-time temperature of the wafer W, the real-time angle of the included angle θ, and a real-time pressure applied to the wafer W to the control element 130 in real-time, so that the control element 130 may opportunely adjust various parameters of the annealing process.

Referring to FIG. 1 and FIG. 2, for example, in the embodiment, the annealing process performed by the wafer processing apparatus 10 may include following steps: first, the heat source 140 is controlled to heat the wafer W, and when the temperature detector 150 detects that a difference between the real-time temperature of the wafer W and the predetermined annealing temperature is substantially zero, the control element 130 controls the rotating mechanism 120 to drive the first pressure applying head 112 and the second pressure applying head 114 to rotate to adjust the included angle θ to a predetermined angle. Then, in the case that the difference between the real-time temperature of the wafer W and the predetermined annealing temperature is substantially zero, the control element 130 controls the pressure applying element 110 to start applying a pressure to the wafer W, and a real-time pressure detected by the pressure detector 170 is substantially equal to a predetermined pressure to complete the annealing process.

For example, in the embodiment, the heat source 140 may heat the wafer W so that a temperature of the wafer W falls within a range of 1000° C. to 2000° C.; the rotatable element 120 may make the included angle θ between the first working surface 112a of the first pressure applying head 112 and the second working surface 114a of the second pressure applying head 114 and the reference plane RP to fall within a range of 0° to 45°. Preferably, the wafer W is placed flat and heated from room temperature to 1500° C., the rotatable element 120 is controlled to drive the first pressure applying head 112 and the second pressure applying head 114 to rotate, and the included angle θ between the first working surface 112a and the second working surface 114a and the reference plane RP is adjusted to 25°, but the invention is not limited thereto.

It should be noted that during the annealing process performed by the wafer processing apparatus 10, a magnitude of the pressure applied to the wafer W by the pressure applying element 110, the time during which the pressure applying element 110 applies the pressure on the wafer W, the heating temperature of the heat source 140 on the wafer W, and/or a magnitude of the included angle θ are adjustable. In other words, during the annealing process of the wafer W, the control element 130 may adjust various parameters of the annealing process at any time to optimize the effect of the wafer processing apparatus 10 in repairing geometric defects of the wafer W.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 3:
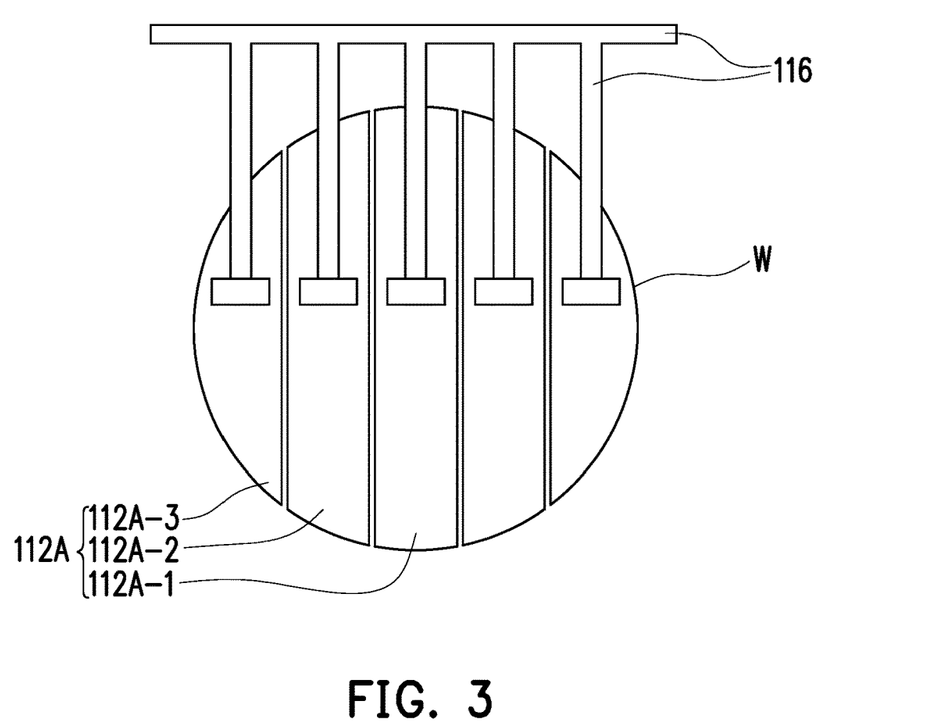
FIG. 3 is a schematic diagram of a first pressure applying head of a wafer processing apparatus according to another embodiment of the invention.
Figure 4:
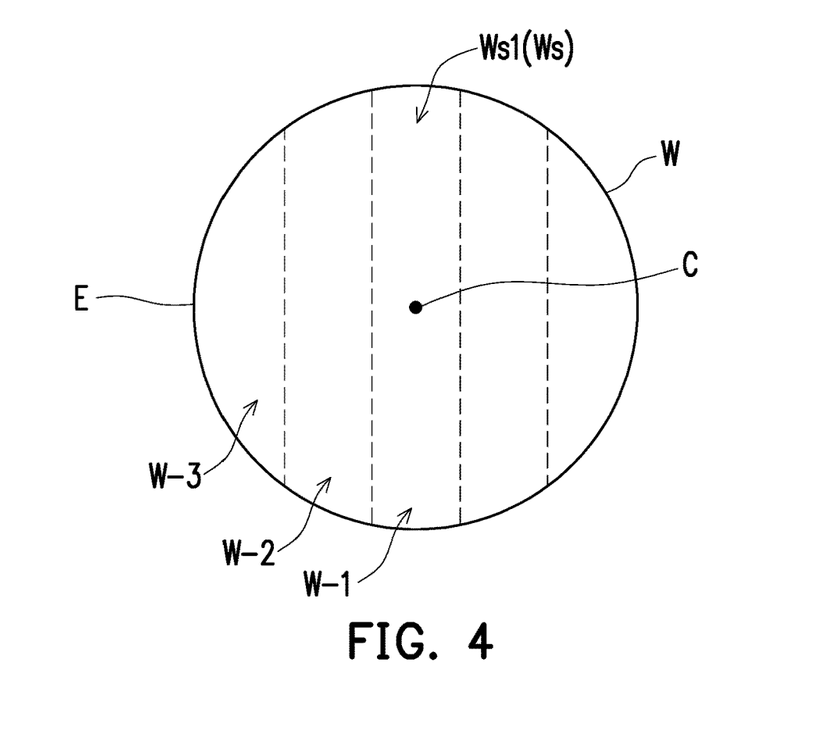
FIG. 4 shows a first surface of a wafer according to another embodiment of the invention.

FIG. 3 is a schematic diagram of a first pressure applying head of a wafer processing apparatus according to another embodiment of the invention. FIG. 4 shows a first surface of a wafer according to another embodiment of the invention.

Figure 5:
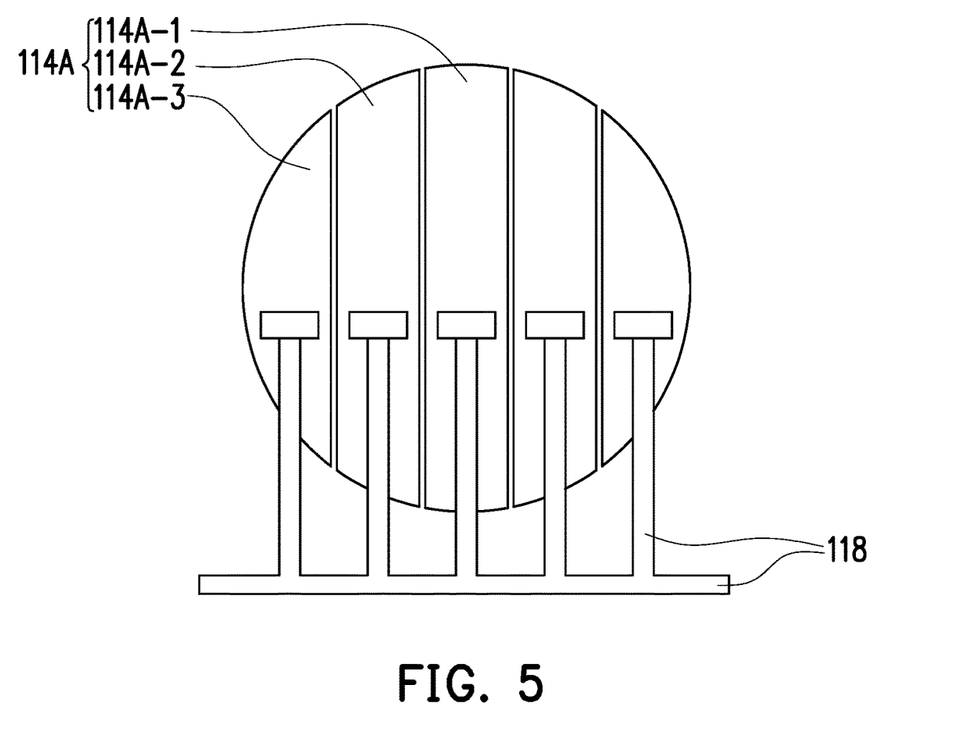
FIG. 5 is a schematic diagram of a second pressure applying head of a wafer processing apparatus according to another embodiment of the invention.
Figure 6:
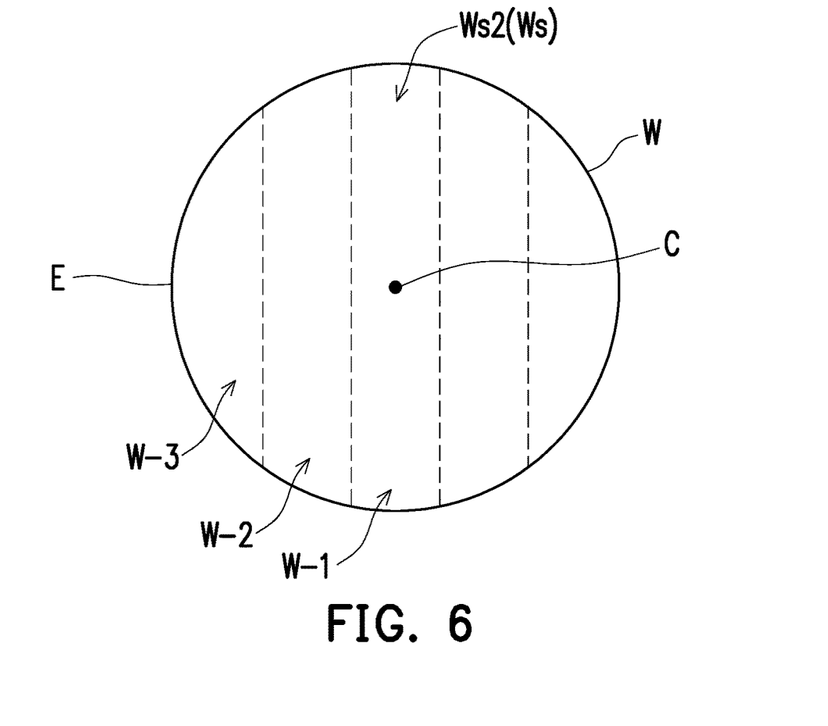
FIG. 6 shows a second surface of a wafer according to another embodiment of the invention.

FIG. 5 is a schematic diagram of a second pressure applying head of a wafer processing apparatus according to another embodiment of the invention. FIG. 6 shows a second surface of a wafer according to another embodiment of the invention.

Referring to FIG. 4 and FIG. 6, surfaces Ws of the wafer W include a first surface Ws1 and a second surface Ws2 opposite to each other. Referring to FIG. 3 and FIG. 4, in the embodiment, the first pressure applying head 112A has a plurality of upper pressure applying portions 112A-1, 112A-2, 112A-3, the plurality of upper pressure applying portions 112A-1, 112A-2, 112A-3 are adapted for applying pressure to the wafer W from the first surface Ws1 of the wafer W, and the plurality of upper pressure applying portions 112A-1, 112A-2, 112A-3 are structurally separated from each other and respectively correspond to a plurality of regions W-1, W-2, W-3 of the wafer W. Referring to FIG. 5 and FIG. 6, in the embodiment, the second pressure applying head 114A has a plurality of lower pressure applying portions 114A-1, 114A-2, 114A-3, and the plurality of lower pressure applying portions 114A-1, 114A-2, 114A-3 are adapted for applying pressure to the wafer W from the second surface Ws2 of the wafer W, and the plurality of lower pressure applying portions 114A-1, 114A-2, 114A-3 are structurally separated from each other and respectively correspond to the plurality of regions W-1, W-2, W-3 of the wafer W.

Referring to FIG. 4 and FIG. 6, for example, in the embodiment, the plurality of regions W-1, W-2, and W-3 of the wafer W include a first region W-1, a second region W-2 and a third region W-3, a geometric center C of the wafer W is located in the first region W-1, the third region W-3 of the wafer W has an edge E of the wafer W, and the second region W-2 is located between the first region W-1 and the third region W-3. Referring to FIG. 3 and FIG. 4, the plurality of upper pressure applying portions 112A-1, 112A-2, 112A-3 of the first pressure applying head 112A include a first upper pressure applying portion 112A-1, a second upper pressure applying portion 112A-2 and a third upper pressure applying portion 112A-3 respectively corresponding to the first region W-1, the second region W-2 and the third region W-3 of the wafer W. Referring to FIG. 5 and FIG. 6, the plurality of lower pressure applying portions 114A-1, 114A-2, 114A-3 of the second pressure applying head 114A include a first lower pressure applying portion 114A-1, a second lower pressure applying portion 114A-2, and a third lower pressure applying portion 114A-3 respectively corresponding to the first region W-1, the second region W-2 and the third region W-3 of the wafer W. The first upper pressure applying portion 112A-1 and the first lower pressure applying portion 114A-1 are adapted to apply a first pressure to the first region W-1 of the wafer W, the second upper pressure applying portion 112A-2 and the second lower pressure applying portion 114A-2 are adapted to apply a second pressure to the second region W-2 of the wafer W, and the third upper pressure applying portion 112A-3 and the third lower pressure applying portion 114A-3 are adapted to apply a third pressure to the third region W-3 of the wafer W, where the first pressure is greater than the second pressure, and the second pressure is greater than the third pressure. In brief, in the embodiment, the first pressure applying head 112A and the second pressure applying head 114A may respectively have a plurality of pressure applying portions separated from each other to apply different pressures to different regions of the wafer W in response to various geometric defects in different regions of the wafer W.

What is claimed is:

1. A wafer processing apparatus, comprising:
   a pressure applying element, comprising:
      a first pressure applying head, having a first working surface;
      a second pressure applying head, having a second working surface, wherein the first pressure applying head and the second pressure applying head are adapted to abut against each other to clamp a wafer between the first working surface and the second working surface, and press the wafer along a pressure applying direction;

a first pressure applying shaft, connected to the first pressure applying head; and a second pressure applying shaft, connected to the second pressure applying head, wherein an axial direction of the first pressure applying shaft and an axial direction of the second pressure applying shaft are substantially parallel to the pressure applying direction, and a projection position of the first pressure applying shaft on the wafer is misaligned with a projection position of the second pressure applying shaft on the wafer;

a rotatable element, connected to the pressure applying element;

a control element, adapted to control the rotatable element to drive the first pressure applying head and the second pressure applying head to rotate, so as to adjust an included angle between the first working surface and the second working surface and a reference plane, wherein a normal direction of the reference plane is substantially parallel to the pressure applying direction; and a heat source, adapted to heat the wafer clamped between the first working surface and the second working surface.

2. The wafer processing apparatus as claimed in claim 1, wherein the heat source comprises a radio frequency coil surrounding the wafer.

3. The wafer processing apparatus as claimed in claim 1, further comprising:

a plurality of sacrificial layers, disposed on the first working surface and the second working surface to contact the wafer, respectively.

4. The wafer processing apparatus as claimed in claim 1, further comprising:

a temperature detector, adapted to detect a real-time temperature of the wafer, and electrically connected to the control element.

5. The wafer processing apparatus as claimed in claim 4, wherein the control element is adapted to control the rotatable element to drive the first pressure applying head and the second pressure applying head to rotate according to a difference between the real-time temperature of the wafer and a predetermined annealing temperature, so as to adjust the included angle to a predetermined angle.

6. The wafer processing apparatus as claimed in claim 4, wherein the control element is adapted to control the pressure applying element to apply a predetermined pressure to the wafer according to a difference between the real-time temperature of the wafer and a predetermined annealing temperature.

7. The wafer processing apparatus as claimed in claim 4, wherein the control element is adapted to adjust a heating power of the heat source according to the real-time temperature of the wafer.

8. The wafer processing apparatus as claimed in claim 1, further comprising:

an angle detector, adapted to detect a real-time angle of the included angle, and electrically connected to the control element, wherein the control element is adapted to control the rotatable element to drive the first pressure applying head and the second pressure applying head to rotate according to the real-time angle.

9. The wafer processing apparatus as claimed in claim 1, further comprising:

a pressure detector, adapted to detect a real-time pressure applied to the wafer by the first pressure applying head and the second pressure applying head, and electrically connected to the control element, wherein the control element is adapted to adjust a magnitude of pressure applied to the wafer by the pressure applying element according to the real-time pressure.

10. The wafer processing apparatus as claimed in claim 1, wherein the control element is adapted to control a time during which the pressure applying element presses the wafer.

11. The wafer processing apparatus as claimed in claim 1, wherein the control element is adapted to control a time that the rotatable element maintains the included angle to a predetermined angle.

12. The wafer processing apparatus as claimed in claim 1, wherein the first pressure applying head has a plurality of upper pressure applying portions, the second pressure applying head has a plurality of lower pressure applying portions, the plurality of upper pressure applying portions are structurally separated from each other and correspond to a plurality of regions of the wafer, respectively, and the plurality of lower pressure applying portions are structurally separated from each other and correspond to the plurality of regions of the wafer, respectively.

13. The wafer processing apparatus as claimed in claim 12, wherein the plurality of regions of the wafer comprise a first region, a second region, and a third region, a geometric center of the wafer is located in the first region, the third region of the wafer has an edge of the wafer, and the second region is located between the first region and the third region;

the plurality of upper pressure applying portions comprise a first upper pressure applying portion, a second upper pressure applying portion, and a third upper pressure applying portion corresponding to the first region, the second region and the third region of the wafer, respectively;

the plurality of lower pressure applying portions comprise a first lower pressure applying portion, a second lower pressure applying portion, and a third lower pressure applying portion corresponding to the first region, the second region, and the third region of the wafer, respectively;

the first upper pressure applying portion and the first lower pressure applying portion are adapted for applying a first pressure to the first region of the wafer, the second upper pressure applying portion and the second lower pressure applying portion are adapted for applying a second pressure to the second region of the wafer, the third upper pressure applying portion and the third lower pressure applying portion are adapted for applying a third pressure to the third region of the wafer, the first pressure is greater than the second pressure, and the second pressure is greater than the third pressure.

14. A wafer processing apparatus, comprising:

a pressure applying element, comprising:

a first pressure applying head, having a first working surface;

a second pressure applying head, having a second working surface;

a first pressure applying shaft, connected to the first pressure applying head; and a second pressure applying shaft, connected to the second pressure applying head, wherein the first pressure applying shaft is misaligned with the second pressure applying shaft;

a rotatable element, connected to the pressure applying element;

a control element, electrically connected to the rotatable element; and a heat source, disposed beside the pressure applying element.

15. The wafer processing apparatus as claimed in claim 14, wherein the heat source comprises a radio frequency coil.

16. The wafer processing apparatus as claimed in claim 14, further comprising:

a plurality of sacrificial layers, disposed on the first working surface and the second working surface, respectively.

17. The wafer processing apparatus as claimed in claim 14, further comprising:

a temperature detector, electrically connected to the control element.

18. The wafer processing apparatus as claimed in claim 14, further comprising:

an angle detector, electrically connected to the control element.

19. The wafer processing apparatus as claimed in claim 14, further comprising:

a pressure detector, electrically connected to the control element.

20. The wafer processing apparatus as claimed in claim 14, wherein the first pressure applying head has a plurality of upper pressure applying portions, and the second pressure applying head has a plurality of lower pressure applying portions, the plurality of upper pressure applying portions are structurally separated from each other, and the plurality of lower pressure applying portions are structurally separated from each other and correspond to the plurality of upper pressure applying portions, respectively.

* * * * *